(12) United States Patent
Coates et al.

(10) Patent No.: US 6,319,367 B1
(45) Date of Patent: Nov. 20, 2001

(54) PLASMA TREATMENT FOR PRODUCING ELECTRON EMITTERS

(75) Inventors: Don Mayo Coates, Santa Fe; Kevin Carl Walter, Los Alamos, both of NM (US)

(73) Assignees: E.I. duPont de Nemours and Co., Wilmington, DE (US); The Regents of the University of California, Oakland, CA (US)

(*) Notice: Subject to any disclaimer, the term of this patent is extended or adjusted under 35 U.S.C. 154(b) by 0 days.

(21) Appl. No.: 09/582,837
(22) PCT Filed: Jan. 5, 1999
(86) PCT No.: PCT/US99/00082
  § 371 Date: Jun. 30, 2000
  § 102(e) Date: Jun. 30, 2000
(87) PCT Pub. No.: WO99/35667
  PCT Pub. Date: Jul. 15, 1999

Related U.S. Application Data

(60) Provisional application No. 60/071,055, filed on Jan. 9, 1998.

(51) Int. Cl.$^7$ .................................................. B01J 19/08
(52) U.S. Cl. ................ 204/164; 204/192.34; 204/192.35
(58) Field of Search ................ 204/164, 192.34, 204/192.35

(56) References Cited

U.S. PATENT DOCUMENTS 5,713,775 * 2/1998 Geis et al. .................... 445/35

FOREIGN PATENT DOCUMENTS 0 712 943 A * 5/1996 (EP).
08 222122 * 8/1996 (JP).

* cited by examiner

*Primary Examiner*—K. Mayekar

(57) ABSTRACT

Plasma treatment for producing carbonaceous field emission electron emitters is disclosed. A plasma of ions is generated in a closed chamber and used to surround the exposed surface of a carbonaceous material. A voltage is applied to an electrode that is in contact with the carbonaceous material. This voltage has a negative potential relative to a second electrode in the chamber and serves to accelerate the ions toward the carbonaceous material and provide an ion energy sufficient to etch the exposed surface of the carbonaceous material but not sufficient to result in the implantation of the ions within the carbonaceous material. Preferably, the ions used are those of an inert gas or an inert gas with a small amount of added nitrogen.

14 Claims, No Drawings

PLASMA TREATMENT FOR PRODUCING ELECTRON EMITTERS

This application is a 371 of PCT/US99/00082, filed Jan. 15, 1999, which claims the benefit of U.S. Provisional application Ser. No. 60/071,055, filed Jan. 09, 1998.

This invention provides a plasma treatment for producing field emission electron emitters. This invention is the result of a contract with the Department of Energy (Contract No. W-7405-ENG-36).

FIELD OF THE INVENTION

BACKGROUND OF THE INVENTION

Field emission electron sources, often referred to as field emission materials or field emitters, can be used in a variety of electronic applications, e.g., vacuum electronic devices, flat panel computer, television and other display screens, emission gate amplifiers and klystrons and in lighting.

Display screens are used in a wide variety of applications such as home and commercial televisions, laptop and desktop computers and indoor and outdoor advertising and information presentations. Flat panel displays are only a few inches thick in contrast to the deep cathode ray tube monitors found on most televisions and desktop computers. Flat panel displays are a necessity for laptop computers, but also provide advantages in weight and size for many of the other applications. Currently laptop computer flat panel displays use liquid crystals which can be switched from a transparent state to an opaque one by the application of small electrical signals. It is difficult to reliably produce these displays in sizes larger than that suitable for laptop computers or for operation over a wide temperature range.

Plasma displays have been used as an alternative to liquid crystal displays. A plasma display uses tiny pixel cells of electrically charged gases to produce an image and requires relatively high electrical power to operate.

Flat panel displays having a cathode using a field emission electron source, i.e., a field emission material or field emitter, and a phosphor capable of emitting light upon bombardment by electrons emitted by the field emitter have been proposed. Such displays have the potential for providing the visual display advantages of the conventional cathode ray tube and the depth and weight advantages of the other flat panel displays with the additional advantage of lower power consumption than the other flat panel displays. U.S. Pat. Nos. 4,857,799 and 5,015,912 disclose matrix-addressed flat panel displays using micro-tip, i.e., Spindt tip, cathodes constructed of tungsten, molybdenum or silicon. WO 94-15352, WO 94-15350 and WO 94-28571 disclose flat panel displays wherein the cathodes have relatively flat mission surfaces.

R. S. Robinson et al., J. Vac. Sci. Technolo. 21, 1398 (1983) disclose the formation of cones on the surfaces of substrates under ion bombardment. The effect was reported for various substrate materials and were generated by simultaneously sputtering a surface at high energy while seeding it with impurity atoms deposited at low energy. They also disclosed the formation of carbon whiskers up to 50 $\mu$m in length when a graphite substrate was ion-bombarded with impurities from a stainless steel target.

J. A. Floro et al., J. Vac. Sci. Technolo. A 1, 1398 (1983) disclose the formation of whiskers during relatively high current density ion bombardment of heated graphite substrates. The whiskers were disclosed to be 2–50 $\mu$m in length and 0.05–0.5 $\mu$m in diameter and to grow parallel to the ion beam. Simultaneous impurity seeding was reported to inhibit whisker growth. J. A. van Vechten et al., J. Crystal Growth 82,289 (1987) discuss the growth of whiskers from graphite surfaces under ion sputtering conditions. They note that the whiskers of smallest diameter, characteristically about 15 nm, definitely appear to be different from either diamond or the scrolled-graphite structure found in carbon fibers grown by catalytic pyrolysis of hydrocarbons. Larger whiskers with diameters ranging from 30 to 100 nm were also observed to grow in sputtering systems. The smaller diameter whiskers are constant in diameter along the length while the larger diameter whiskers may have a slight taper.

M. S. Dresselhaus et al., Graphite Fibers and Filaments (Springer-Verlag, Berlin, 1988), pp. 32–34, disclose that filaments may be grown on several types of hexagonal carbon surfaces, but not on diamond or glassy carbon.

T. Asano et al., J. Vac. Sci. Technol. B 13, 431 (1995) disclose increased electron emission from diamond films which have been deposited on silicon by chemical vapor deposition, argon ion milled to form diamond cones and then annealed at 600° C. These cones are formed if the diamond is in the form of isolated grains.

C. Nützenadel et al., Appl. Phys. Lett. 69, 2662 (1996) disclose field emission from cones etched into both synthetic boron-doped diamond and silicon by ion sputtering.

J. R. Conrad, U.S. Pat. No. 4,764,394 discloses ion implantation using a plasma of ions.

In view of this art, there is still a need for a process for readily and economically producing both small and large sized highly emitting field emission electron emitters in large quantities for use in various flat panel applications. Other objects and advantages of the present invention will become apparent to those skilled in the art upon reference to the detailed description which hereinafter follows.

SUMMARY OF THE INVENTION

The invention provides a process for producing a carbonaceous field emission electron emitter, which comprises:

(a) positioning a carbonaceous material in a closed chamber in contact with one of the two electrodes provided in the chamber;

(b) evacuating the chamber;

(c) generating a plasma of ions which surrounds the exposed surface of the carbonaceous material; and (d) applying to the electrode in contact with the carbonaceous material a negative voltage relative to the other electrode in the chamber to thereby accelerate the ions in the plasma toward the carbonaceous material and provide an ion energy sufficient to etch the exposed surface of the carbonaceous material but not sufficient to result in the implantation of these ions within the carbonaceous material.

It is preferred to mask any portions of the substrate that would otherwise be exposed to the plasma and any desired portions of the carbonaceous material that are not to be exposed to the plasma. Especially preferred is a graphite mask.

If the walls of the chamber are made of an electrically conducting material, the walls can serve as one of the electrodes.

The ions used are those of an inert gas (i.e., argon, neon, krypton or xenon), oxygen, nitrogen, hydrogen or mixtures thereof. Preferably, the ions used are those of an inert gas or an inert gas with a small amount of added nitrogen.

The voltage applied is from about 100 V to about 20 kV, preferably from about 1 kV to about 10 kV. The pulse frequency of this applied voltage typically ranges from about 100 Hz to 30 kHz, preferably from about 1 kHz to about 25 kHz. The pulse width is about 5 $\mu$sec to about 50 $\mu$sec, preferably from about 5 $\mu$sec to about 20 $\mu$sec.

The pressure in the chamber during the process is from about $1\times10^{-5}$ torr ($1.3\times10^{-3}$ Pa) to about 10 mtorr (1.3 Pa), preferably from about $1\times10^{-5}$ torr ($1.3\times10^{-3}$ Pa) to about $10\times10^{-5}$ torr ($1.3\times10^{-2}$ Pa).

DETAILED DESCRIPTION OF THE PREFERRED EMBODIMENTS

The use of a plasma provides a novel process to produce a carbonaceous field emission electron emitter. This plasma-based process utilizes the ions in the plasma for bombarding the carbonaceous material and forming a multitude of small needle-like structures on the surface of the carbonaceous material. These structures have aspect ratios which are typically five-to-one or greater. The plasma surrounds the exposed surfaces of the carbonaceous material. In contrast, conventional ion beam bombardment is a line-of-sight process in the sense that only a region directly in the path of the beam is subjected to ion bombardment and therefore relatively small areas, defined by the aperture of the ion gun's line-of-sight opening, are affect. Since the plasma-based process is not line-of-sight, very large surface areas can be processed simultaneously, essentially limited only by the size of the vacuum chamber used. This provides great practical advantage by enabling the production of large area electron emitters for use in large area flat panel displays as well as for enabling the economical production of a quantity of smaller area electron emitters for use in smaller area flat panel displays.

The process of the invention can be used to produce a field emission electron emitter from a carbonaceous material that shows no measurable field emission as well as for improving the field emission of an electron emitter comprised of a carbonaceous material.

As used herein, "carbonaceous material" means material such as graphite, amorphous carbon, diamond, diamond-like carbon and other carbon-based materials.

The apparatus needed to carry out the process of the invention is a vacuum chamber of sufficient size to hold the carbonaceous material to be treated, a high voltage pulsed power supply to apply bias to the carbonaceous material, means to supply the gas from which the plasma is created, a plasma excitation source and two electrodes. If the walls of the chamber are made of an electrically conducting material, the walls can serve as one of the electrodes.

The carbonaceous material is placed in the vacuum chamber in contact with one of the two electrodes and the chamber is then evacuated. A gas is introduced into the evacuated chamber and a plasma generated by ionizing the gas using a variety of excitation methods such as radio frequency (RF) input, either inductive or capacitive; glow discharge; microwave; hot filament and other excitation input methods commonly known to those working in the field. However the preferred plasma sources are capable of treating large surface areas (many square feet) simultaneously and thus, rf and glow discharge plasmas are preferred. The plasma formed surrounds the exposed surface of the carbonaceous material and is the source of the ions which bombard and etch this exposed surface. The electrode in contact with the carbonaceous material to be treated is negatively pulsed biased with respect to the other electrode to extract the positive ions from the plasma and accelerate them toward the exposed surface of the carbonaceous material. Upon impinging upon this surface, the ions selectively etch or sputter the carbon. The result is a carbon surface with a topology resembling closely packed cones and stiff hairs or needles. The dose, i.e., the number of ions impinging on a unit area of the surface, is determined by the time of exposure, the current through the sample, the area treated, the voltage pulse frequency and the pulse width. There is an optimum dose. The dose must be sufficient to produce the desired topology but not so great as to etch away the desired topology and the carbonaceous material. The dose will depend on the particular ions chosen; heavier ions etch more rapidly than lighter ions.

The desired dose will vary with ion mass and ion energy. With 2 keV argon ions, typical doses are $1\times10^{18}$ ions/cm$^2$ to $1\times10^{20}$ ions/cm$^2$, preferably from about $5\times10^{18}$ ions/cm$^2$ to about $5\times10^{19}$ ions/cm$^2$.

For room temperature conditions, the ion energies should be in the range of from about 100 eV to about 20 keV, preferably from about 1 keV to about 10 keV so that the voltage applied to the carbonaceous material is from about 100 V to about 20 kV, preferably from about 1 kV to about 10 kV. The pulse frequency of this applied voltage typically ranges from about 100 Hz to 30 kHz, preferably from about 1 kHz to about 25 kHz. The pulse width is about 5 $\mu$sec to about 50 $\mu$sec, preferably from about 5 $\mu$sec to about 20 $\mu$sec.

The pressure in the chamber during the process is from about $1\times10^{-5}$ torr ($1.3\times10^{-3}$ Pa) to about 10 torr (1.3 Pa), preferably from about $1\times10^{-5}$ torr ($1.3\times10^{-3}$ Pa) to about $10\times10^{-5}$ torr ($1.3\times10^{-2}$ Pa). Preferably, the ions used are those of an inert gas or an inert gas with a small amount of added nitrogen. Most preferably, the ions used are those of argon or argon with a small amount of added nitrogen. "A small amount of added nitrogen" is used herein to mean up to about 20 volume % nitrogen.

The carbonaceous material to be treated can be of various forms, e.g., a bar or planar section of carbon or, more typically, a layer deposited directly onto a substrate or onto a conducting film that has been deposited on a substrate. The carbonaceous material can be carbon or a composite of carbon and one or more other components. Various processes can be used to form a layer of carbonaceous material, but a preferred process is to screen print a paste comprised of graphite particles and glass frit onto a substrate in the desired pattern and to then fire the dried patterned paste. For a wider variety of applications, e.g., those requiring finer resolution, the preferred process comprises screen printing a paste which further comprises a photoinitiator and a photo-hardenable monomer, photo-patterning the dried paste, developing and firing the patterned dried paste.

The substrate can be any trial to which the glass of the paste will adhere. Non-conducting substrates will require a film of an electrical conductor to serve as the cathode electrode and provide means to apply a voltage to and supply electrons to the carbonaceous material. Silicon, a glass, a metal or a refractory material such as alumina can serve as the substrate.

As used herein, "substrate" means the structure on which the layer of composite is formed, either a single material or a combination of materials, e.g., a non-conducting material such as glass with a layer of an electrical conductor. A preferred technique for providing such an electrically conducting layer is to form a conducting composite by screen printing and firing a silver or gold conductor composition.

When screen printing or photopatterning is used to form a layer of composite, the preferable substrate comprises glass and soda lime glass is especially preferred.

The paste used for screen printing typically contains graphite particles, low softening point glass frit, an organic medium, solvent and surfactant. As used herein, "graphite particles" means the particles of the usual hexagonal graphite, both synthetic and natural forms. The role of the medium and solvent is to suspend and disperse the particulate constituents, i.e., the solids, in the paste with a proper rheology for typical patterning processes such as screen printing. There are a large number of such mediums known in the art. Examples of resins that can be used are cellulosic resins such as ethyl cellulose and alkyd resins of various molecular weights. Butyl carbitol, butyl carbitol acetate, dibutyl carbitol, dibutyl phthalate and terpineol are examples of useful solvents. These and other solvents are formulated to obtain the desired viscosity and volatility requirements. A surfactant can be used to improve the dispersion of the particles. Organic acids such oleic and stearic acids and organic phosphates such as lecithin or Gafac® phosphates are typical surfactants. A glass frit that softens sufficiently at the firing temperature to adhere to the substrate and to the graphite particles is required. A lead glass frit has been used in the Examples but other glasses with low softening points such as calcium or zinc borosilicates can be used. Preferably the graphite particles have least dimensions of 1 $\mu$m. If a layer of composite with higher electrical conductivity is desired, the paste also contains a metal such as silver or gold. The paste typically contains about 40 wt % to about 60 wt % solids based on the total weight of the paste. These solids comprise graphite particles and glass frit or graphite particles, glass frit and metal. The volume percent of graphite particles is about 35% to about 80% of the total volume of the solids. Variations in the composition can be used to adjust the viscosity and the final thickness of the printed material.

The paste is typically prepared by milling a mixture of graphite particles, low softening point glass frit, organic medium, surfactant and a solvent. The paste mixture can be screen printed using well-known screen printing techniques, e.g., by using a 165–400 mesh stainless steel screen. The paste is deposited in the form of a desired pattern, e.g., discrete elements, interconnected areas or a continuous film. The screen-printed paste is dried before firing, typically by heating at 125° C. for about 10 minutes. When the substrate comprises glass, the dried paste is then fired at a temperature of about 450° C. to about 575° C., preferably from about 475° C. to about 525° C., for about 10 minutes. Higher firing temperatures can be used with substrates which can endure them. It is during this firing step that the organic materials are volatilized leaving the layer of composite comprised of graphite particles and glass. Surprisingly, the graphite particles undergo no appreciable oxidation or other chemical or physical change during the firing. If the screen-printed paste is to be photopatterned, the paste contains a photoinitiator and a photohardenable monomer comprised, for example, of at least one addition polymerizable ethylenically unsaturated compound having at least one polymerizable ethylenic group. Scanning electron micrographs (SEM) of the fired material show that the graphite particles make up a large portion of the surface area of the composite layer of graphite particles and glass. Typically, 80% or more of the surface area is comprised of portions of graphite particles.

The layer of deposited paste decreases in thickness upon firing. Preferably, the thickness of the fired layer of composite is from about 5 $\mu$m to about 30 $\mu$m.

When the carbonaceous material is in the form of a layer on a substrate and when the layer does not cover the entire substrate, portions of the surface that would be exposed to the plasma would be substrate material. For example, when the carbonaceous material is not a continuous film but rather a pattern of discrete elements or interconnected areas, portions of the substrate would be exposed to the plasma. When the substrate consists of a non-conducting material such as glass with a layer of an electrical conductor, portions of the glass and/or the electrical conductor would be exposed to the plasma. Even when the carbonaceous material is in the form of a continuous layer, there may be portions of the substrate, e.g., the glass and/or electrical conductor, surrounding the carbonaceous material that would be exposed to the plasma. In another instance, in order to provide discrete areas of a continuous layer of carbonaceous material which can serve as areas of good electron emission separated by regions having greatly reduced emission, it is necessary to prevent portions of the continuous layer of carbonaceous material from being exposed to the plasma. In all these instances, it is preferred to mask any portions of the substrate that would otherwise be exposed to the plasma and any desired portions of the carbonaceous material that are not to be exposed to the plasma. The use of such a mask is preferred in order to consistently produce the desired electron emitter. Especially preferred is a graphite mask.

Field emission tests can be carried out on the resulting samples using a flat-plate emission measurement unit comprised of two electrodes, one serving as the anode or collector and the other serving as the cathode. The unit is comprised of two square copper plates, 1.5 in by 1.5 in (3.8 cm×3.8 cm), with all corners and edges rounded to minimize electrical arcing. Each copper plate is embedded in a separate polytetrafluoroethylene (PTFE) block, 2.5 in×2.5 in (4.3 cm×4.3 cm), with one 1.5 in by 1.5 in (3.8 cm×3.8 cm) copper plate surface exposed on the front side of the PTFE block. Electrical contact to the copper plate is made by a metal screw through the back of the PTFE block and extending into the copper plate, thereby providing a means to apply an electrical voltage to the plate and means to hold the copper plate firmly in place. The two PTFE blocks are positioned with the two exposed copper plate surfaces facing one another and in register with the distance between the plates fixed by means of glass spacers placed between the PTFE blocks but distanced from the copper plates to avoid surface leakage currents or arcing. The separation distance between the electrodes can be adjusted, but once chosen, it is fixed for a given set of measurements on a sample. Typically, separations of 0.5 mm to about 2 mm can be used.

The sample is placed on the copper plate serving as the cathode. In the case of a conducting substrate, a sample can be held in place and electrical contact made by applying a small drop of carbon paint to the back of the sample and allowing it to dry. In the case of an insulating substrate with a conducting film, the substrate is held down on two sides with conducting copper tape, which also serves to provide for electrical contact.

The test apparatus is inserted into a vacuum system, and the system is evacuated to a base pressure below $1 \times 10^{-6}$ torr ($1.3 \times 10^{-4}$ Pa). A negative voltage is applied to the cathode and the emission current is measured as a function of the applied voltage. The separation distance between the plates is measured.

EXAMPLES OF THE INVENTION

The following non-limiting Examples are intended to further enable and describe the invention. All parts and percentages are by weight unless otherwise specified.

EXAMPLE 1

A carbonaceous field emission electron emitter was prepared using the following procedure. A paste comprised of graphite particles and glass frit was screen printed onto a substrate and fired to form a layer of composite which comprises graphite particles and glass. The substrate was comprised of a layer of silver conductor composition on a glass slide.

The substrate was prepared by Screen printing a 22 mm×22 mm layer of silver conductor composition (DuPont #7095 Silver Conductor Composition, a screen printable thick film composition available from E. I. du Pont de Nemours and Company, Wilmington, Del.) onto a 1 inch×1 inch (2.5 cm×2.5 cm) glass slide using a 200 mesh screen and firing the dried layer at a temperature of 525° C. for 10 minutes to produce a conducting silver composite layer.

A paste comprised of graphite particles and glass frit was prepared by mixing 25% NatMwu HPN-10 graphite powder, 25% glass, 37% medium, 10% β-terpineol and 3% soya lecithin. The glass used has a composition of 1.6% $SiO_2$, 1.7% $Al_2O_3$, 85.8% PbO, 10.9% $B_2O_3$ and the medium used was comprised of 10% N-22 ethyl cellulose, 30% diethyleneglycol, 30% dibutyl ether and 30% β-terpineol. The mixture was roll milled using a three roll mill at a roll pressure of 100/200 psi (6.9/13.8×$10^5$ Pa). On the basis of the total volume of solids, i.e., the graphite particles and the glass frit, the volume percent of graphite particles was 74%.

The paste was applied to the silver composite layer on the glass slide in a 14 mm×14 mm square pattern using a 200 mesh screen. The dried paste was then fired in air by increasing the temperature at a rate of 20° C. per minute to a temperature of 525° C., maintaining the temperature at 525° C. for 10 minutes, and then cooling to ambient temperature by decreasing the temperature at a rate of 20° C. per minute. The result is the formation of a layer of composite which comprises graphite particles and glass on a substrate.

Scanning electron micrographs (SEM) of the fired material show that the graphite particles make up a large portion of the surface area of the layer of composite and little glass is evident.

A graphite mask was used to cover all but a 1 cm×1 cm area of the layer of composite, i.e., it covered the glass and silver composite layer and the outer portions of the layer of composite adjacent to the silver composite layer, and it is this 1 cm×1 cm area which is exposed to the plasma. The sample was placed in a vacuum chamber with electrically conducting walls and the chamber was then evacuated. Argon was introduced into the chamber and a plasma generated using 1 kW of rf power onto an inductively coupled coil. The chamber pressure was 10 torr (1.33 Pa). A negative voltage pulse of 1400 V was applied to the layer of composite relative to the chamber walls. The pulse frequency was 10 kHz and the pulse width $10^{-5}$ sec. The incident ion dose was estimated to be $10^{18}$ ions/$cm^2$.

Upon removal from the vacuum chamber, a small number of needle-like structures with base diameters of about 0.5 μm and lengths of about 1.5 μm were observed in the exposed area of the sample by scanning electron microscopy.

Emission results from the 1 cm×1 cm area which had been ion bombarded were obtained by placing the glass slide containing the screen printed ion-bombarded graphite particles on the copper block cathode of measurement unit described above. Two pieces of conducting copper tape were applied at each side of the substrate both to hold the substrate in place and to provide electrical contact to the silver composite layer. The separation distance of the surface of the screen printed sample and the copper block anode was 0.6 mm. The emission current was 100 μA at an applied voltage of 4800 V.

EXAMPLE 2

A carbonaceous field emission electron emitter was prepared essentially as described in Example 1 except that the incident ion dose was $10^{19}$ ions/$cm^2$.

Upon removal from the vacuum chamber, the surface of the sample was examined using scanning electron microscopy and the topology of the surface was observed to consist of a large number of larger conical structures with larger base diameters and very fine tips. The base diameters were about 3 μm and the height of the structures was about 5 μm.

Emission results form the 1 cm×1 cm area which had been ion bombarded were obtained by placing the glass slide containing the screen printed ion-bombarded graphite particles on the copper block cathode of measurement unit described above. Two pieces of conducting copper tape were applied at each side of the substrate both to hold the substrate in place and to provide electrical contact to the silver composite layer. The separation distance of the surface of the screen printed sample and the copper block anode was 0.6 mm. The emission current was 200 μA at an applied voltage of 4800 V.

EXAMPLE 3

Two carbonaceous field emission electron emitters were prepared essentially as described in Example 1 for the following differences:

(a) The substrate for one emitter was prepared by screen printing a 22 mm×22 mm layer of silver conductor composition (DuPont #7095 Silver Conductor Composition, a screen printable thick film composition available from E. I. du Pont de Nemours and Company, Wilmington, Del.) onto a 1 inch×1 inch (2.5 cm×2.5 cm) glass slide as in Example 1. The substrate for the second emitter was prepared by screen printing a 7.75 inch×7.75 inch (19.7 cm×19.7 cm) layer of the same silver conductor composition onto an 8 inch×8 inch (20.3 cm×20.3 cm) piece of glass;

(b) For the smaller sample, the paste was applied to the silver composite layer on the glass slide in a 14 mm×14 mm square pattern as in Example 1. For the larger sample, the paste was applied to the silver composite layer on the piece of glass slide in a 6.75 inch×6.75 inch (17.1 cm×17.1 cm) square pattern;

(c) For the smaller sample, a graphite mask was used to cover all of the glass and silver conductor composition that would otherwise be exposed to the plasma and the area of the layer of composite adjacent to the silver conductor composition so that all but a 1 cm×1 cm area of the layer of composite was covered, as in Example 1. For the larger sample, a graphite mask was also used to cover all of the glass and silver conductor composition that would otherwise be exposed to the plasma and the areas of the layer of composite immediately adjacent to the silver conductor composition; and (d) The two samples were placed in the vacuum chamber and simultaneously exposed to the plasma treatment. The chamber pressure was 5×$10^{-5}$ torr (6.7×$10^{-3}$ Pa). A negative voltage pulse of 2000 V was applied to the layer of composite relative to the chamber walls. The pulse frequency was 25 kHz and the incident ion dose was 7.8×$10^{18}$ ions/$cm^2$.

All other conditions were essentially as described in Example 1.

Scanning electron microscope measurements showed that the surfaces of the two samples contained needle-like structures and that the two surfaces were essentially identical. The measurements of the structures indicated a height of 10–15 μm and a base diameter of 0.5–1.0 μm.

The smaller sample was tested for electron emission essentially as described in Example 1. The emission current was 900 μA at an applied voltage of 3100 V. Emission from the larger sample was observed visually. In a vacuum system, a 2 inch×3 inch (5.1 cm×7.6 cm) glass plate, coated first with a layer of indium tin oxide to serve as the cathode electrode and then with a layer of phosphor on top of the layer of indium tin oxide, was placed such that the phosphor was 1 mm from the surface of the larger sample. A negative voltage was applied to the sample and the light observed as a result of the emission appeared bright and uniform.

Although particular embodiments of the present invention have been described in the foregoing description, it will be understood by those skilled in the art that the invention is capable of numerous modifications, substitutions and rearrangements without departing from the spirit or essential attributes of the invention. Reference should be made to the appended claims, rather than to the foregoing specification, as indicating the scope of the invention.

What is claimed is:

1. A process for producing a carbonaceous field emission electron emitter, which comprises:
    (a) positioning a carbonaceous material in a closed chamber in contact with one of the two electrodes provided in said chamber;
    (b) evacuating said chamber;
    (c) generating a plasma of ions which surrounds the exposed surface of said carbonaceous material; and
    (d) applying to said electrode in contact with said carbonaceous material a negative voltage relative to the other said electrode in said chamber to thereby accelerate said ions in said plasma toward said carbonaceous material and provide an ion energy sufficient to etch said exposed surface of said carbonaceous material but not sufficient to result in the implantation of said ions within said carbonaceous material.

2. The process of claim 1, wherein said negative voltage is from about 100 V to about 20 kV.

3. The process of claim 2, wherein said negative voltage is from about 1 kV to about 10 kV.

4. The process of claim 1, wherein the walls of the chamber are made of an electrically conducting material and said walls serve as one of the electrodes.

5. The process of any preceding claim, wherein said ions are ions of an inert gas or an inert gas and nitrogen.

6. The process of claim 5, wherein said ions are ions of argon or argon and nitrogen.

7. The process of claim 6, wherein the pressure in said chamber is from about $1.3\times10^{-3}$ Pa to about 1.3 Pa.

8. The process of claim 5, wherein the number of ions impinging said exposed surface is from about $1\times10^{18}$ ions/cm$^2$ to about $1\times10^{20}$ ions/cm$^2$.

9. The process of claim 5 wherein said carbonaceous material is a layer deposited onto a substrate.

10. The process of claim 9 wherein a mask covers any portions of said substrate which would otherwise be exposed to said plasma.

11. The process of claim 10 wherein said mask covers any portions of said layer of carbonaceous material that are not to be exposed top said plasma.

12. The process of claim 11 wherein said mask is a graphite mask.

13. The process of claim 10 wherein said mask is a graphite mask.

14. A process for improving the field emission of a carbonaceous field emission electron emitter, which comprises:
    (a) positioning said carbonaceous emitter in a closed chamber in contact with one of the two electrodes provided in said chamber;
    (b) evacuating said chamber;
    (c) generating a plasma of ions which surrounds the exposed surface of said carbonaceous emitter; and
    (d) applying to said electrode in contact with said carbonaceous emitter a negative voltage relative to the other said electrode in said chamber to thereby accelerate said ions in said plasma toward said carbonaceous emitter and provide an ion energy sufficient to etch said exposed surface of said carbonaceous emitter but not sufficient to result in the implantation of said ions within said carbonaceous emitter.

* * * * *